United States Patent [19]
Goma

[11] Patent Number: 5,539,359
[45] Date of Patent: Jul. 23, 1996

[54] VOLTAGE-CONTROLLED OSCILLATOR HAVING VOLTAGE-SENSITIVE CAPACITOR WITH BIAS SUPPLY CIRCUIT

[75] Inventor: Shinji Goma, Kyoto, Japan

[73] Assignee: Murata Manufacturing Co., Ltd., Japan

[21] Appl. No.: 412,756

[22] Filed: Mar. 29, 1995

[30] Foreign Application Priority Data

Mar. 31, 1994 [JP] Japan .................................. 6-062451

[51] Int. Cl.⁶ .............................. H03B 5/12; H03B 5/18; H01P 3/08; H01P 7/08
[52] U.S. Cl. .................................. 331/117 D; 331/36 C; 331/96; 331/107 SL; 331/177 V; 333/235; 333/246
[58] Field of Search .......................... 331/96, 99, 100, 331/107 SL, 117 R, 117 FE, 117 D, 177 V, 36 C; 333/335, 246, 247, 260, 263

[56] References Cited

U.S. PATENT DOCUMENTS 4,500,854  2/1985  Meyer ........................... 331/107 SL X
5,187,451  2/1993  Nakamoto et al. ............. 331/177 V X

FOREIGN PATENT DOCUMENTS 2274034  7/1994  United Kingdom .

Primary Examiner—David Mis
Attorney, Agent, or Firm—Ostrolenk, Faber, Gerb & Soffen

[57] ABSTRACT

An impedance adjustment capacitor connected in parallel to a choke coil formed by a conductive pattern formed on a substrate adjusts the impedance of a control voltage applying circuit. A control voltage is applied via the choke coil to a variable capacitance diode included in a resonance circuit. This control voltage determines a resonance frequency.

8 Claims, 2 Drawing Sheets

VOLTAGE-CONTROLLED OSCILLATOR HAVING VOLTAGE-SENSITIVE CAPACITOR WITH BIAS SUPPLY CIRCUIT

DESCRIPTION OF THE BACKGROUND ART

1. Field of the Invention

The present invention relates to voltage-controlled oscillators (hereinafter referred to as VCO). More particularly, the present invention relates to a VCO including a resonance circuit including a variable capacitance diode, to which a control voltage for controlling an oscillation frequency is applied through a choke coil.

2. Prior Art

FIG. 1 is a circuit diagram showing an example of a conventional VCO. Referring to FIG. 1, a VCO10 includes a resonance circuit 1, an oscillation stage 2, a buffer stage 3, and an output matching stage 4. The resonance frequency of resonance circuit 1 is changed in response to a control voltage Vc which is applied to a control terminal C. Oscillation stage 2 determines an oscillation frequency based on the resonance frequency of resonance circuit 1. Buffer stage 3 amplifies a signal provided from oscillation stage 2, and prevents the oscillation frequency of oscillation stage 2 from varying with load fluctuation. Output matching stage 4 attains matching of buffer stage 3 with a next-stage circuit which is connected to an output terminal p and suppresses higher harmonics.

Resonance circuit 1 includes a variable capacitance diode VD, a coupling capacitor C1, a resonance inductor L1, and a resonance capacitor C2. The cathode of variable capacitance diode VD is connected to one end of coupling capacitor C1, to the connection point of which the control voltage applied to control terminal C is applied through a choke coil L2. The anode of variable capacitance diode VD is grounded. The other end of coupling capacitor C1 is connected to one end of resonance inductor L1, one end of resonance capacitor C2, and one end of a coupling capacitor C7. The other end of resonance inductor L1 and the other end of resonance capacitor C2 are grounded. Oscillation stage 2 includes an oscillation transistor Q1, and the other end of coupling capacitor C7 is connected to the base of oscillation transistor Q1. Further, the base of oscillation transistor Q1 is supplied with a voltage, which is obtained by dividing power supply voltage $V_B$ by bias resistors R1 and R2 connected in series between a power supply terminal B and the ground, as a bias voltage. A capacitor C5 is connected between the base and the emitter of oscillation transistor Q1, and a resistor R3 and a capacitor C4 are connected in parallel between the emitter of oscillation transistor Q1 and the ground. Capacitors C5 and C4 are arranged to provide a Colpitts capacitance, and oscillation transistor Q1, capacitors C5 and C4 and resonance inductor L1 form a Colpitts oscillator, to oscillate at the resonance frequency of resonance circuit 1.

An oscillation output from oscillation stage 2 is provided to buffer stage 3 through a coupling capacitor C8. Buffer stage 3 includes a buffer transistor Q2, which is supplied with the oscillation output of oscillation stage 2 at its base. The base of buffer transistor Q2 is supplied with a voltage, which is obtained by dividing power supply voltage $V_B$ by bias resistors R4 and R5 connected in series between power supply terminal B and the ground, as a bias voltage. Further, the emitter of buffer transistor Q2 is grounded, and the collector of buffer transistor Q2 is connected to power supply terminal B through a choke coil L3 included in output matching stage 4.

Output matching stage 4 includes choke coil L3, a coupling capacitor C10, and an output matching capacitor C11. One end of coupling capacitor C10 is connected to the collector of buffer transistor Q2, and the other end thereof is connected to output terminal P. One end of output matching capacitor C11 is connected to output terminal P, and the other end thereof is grounded. Note that a high-frequency bias capacitors C6 and C12 are connected between power supply terminal B and the ground, and that a high-frequency bias capacitor C3 is connected between control terminal C and the ground.

VCO10 shown in FIG. 1 has respective components mounted on a substrate of alumina or the like. The capacitance value of variable capacitance diode VD included in resonance circuit 1 is changed according to the value of control voltage Vc, so that the resonance frequency of resonance circuit 1 changes, oscillation stage 2 oscillates at the resonance frequency, and that the oscillation signal thereof is provided from output terminal P.

Choke coil L2 provided between control terminal C and variable capacitance diode VD shown in FIG. 1, that is, in a portion to which the control voltage is applied, is for removing noise superimposed on a power supply line or the like. Choke coil L2 is generally formed as a conductive pattern printed on the substrate. Change in length of the conductive pattern forming choke coil L2 causes the impedance of a circuit portion to which the control voltage is applied to change. It is experimentally confirmed that this changes various characteristics of a VCO, such as C/N (carrier/noise) characteristics, S/N characteristics, control voltage sensitivity characteristics, and control voltage-to-oscillation frequency characteristics. Therefore, it is necessary to determine the length of the conductive pattern so that the above-described characteristics take prescribed values, respectively, whenever a VCO different in oscillation frequency is designed.

In order to change the length of the conductive pattern for every VCO different in oscillation frequency, however, it is necessary to prepare many kinds of substrates having different conductive patterns, which in turn increases design cost and management cost. Therefore, from the standpoint of mass production, even if the characteristics are deteriorated more or less, a plurality of kinds of VCOs different in oscillation frequency must be manufactured with one kind of substrate.

SUMMARY OF THE INVENTION

A principal object of the present invention is to provide a VCO whose various characteristics can take prescribed values even when a plurality of kinds of VCOs different in oscillation frequency are manufactured with one kind of substrate.

Briefly stated, according to the present invention, a resonance circuit including a variable capacitance diode is mounted on a substrate, a choke coil for supplying the variable capacitance diode with a control voltage is formed on the substrate as a conductive pattern, and an impedance adjustment capacitor for adjusting an impedance is connected to the choke coil in parallel.

Therefore, according to the present invention, by connecting an impedance adjustment capacitor to a choke coil in parallel, the impedance of a portion to which a control voltage is applied is increased according to the capacitance value of the capacitor. More specifically, the structure of the present invention is equal to substantially increasing the length of a conductive pattern forming a choke coil. By changing the capacitance value of the impedance adjustment capacitor, the impedance of the portion to which the control voltage is applied can be adjusted.

More preferably, the resonance circuit includes a coupling capacitor connected in series to the variable capacitance diode, and a resonance inductor and a resonance capacitor respectively connected in parallel to a series circuit of the variable capacitance diode and the coupling capacitor.

The foregoing and other objects, features, aspects and advantages of the present invention will become more apparent from the following detailed description of the present invention when taken in conjunction with the accompanying drawings.

DESCRIPTION OF A PREFERRED EMBODIMENT

Figure 2:
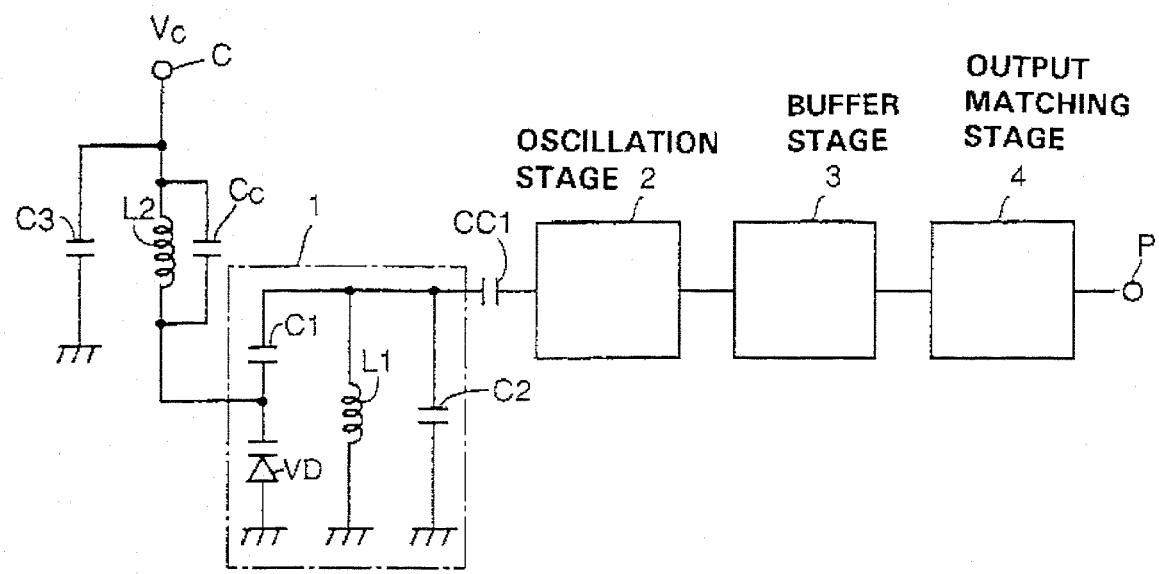
FIG. 2 is a circuit diagram showing the embodiment of the present invention.

FIG. 2 is a circuit diagram of an embodiment of the present invention, showing the resonance circuit peripheral portion 1 as an actual circuit diagram, and showing the other circuit portions block as diagrams.

Referring to FIG. 2, like the conventional VCO, the disclosed VCO includes, between control terminal C and output terminal P, resonance circuit 1 whose resonance frequency is changed according to a control voltage Vc applied to control terminal C, oscillation stage 2, buffer stage 3, and output matching stage 4. Resonance circuit 1 and oscillation stage 2 are coupled by coupling capacitor CC1.

Resonance circuit 1 includes coupling capacitor C1, variable capacitance diode VD, resonance inductor L1, and resonance capacitor C2. Control voltage Vc applied to control terminal C is applied to the cathode of variable capacitance diode VD through choke coil L2. An impedance adjustment capacitor Cc is connected to choke coil L2 in parallel.

Figure 1:
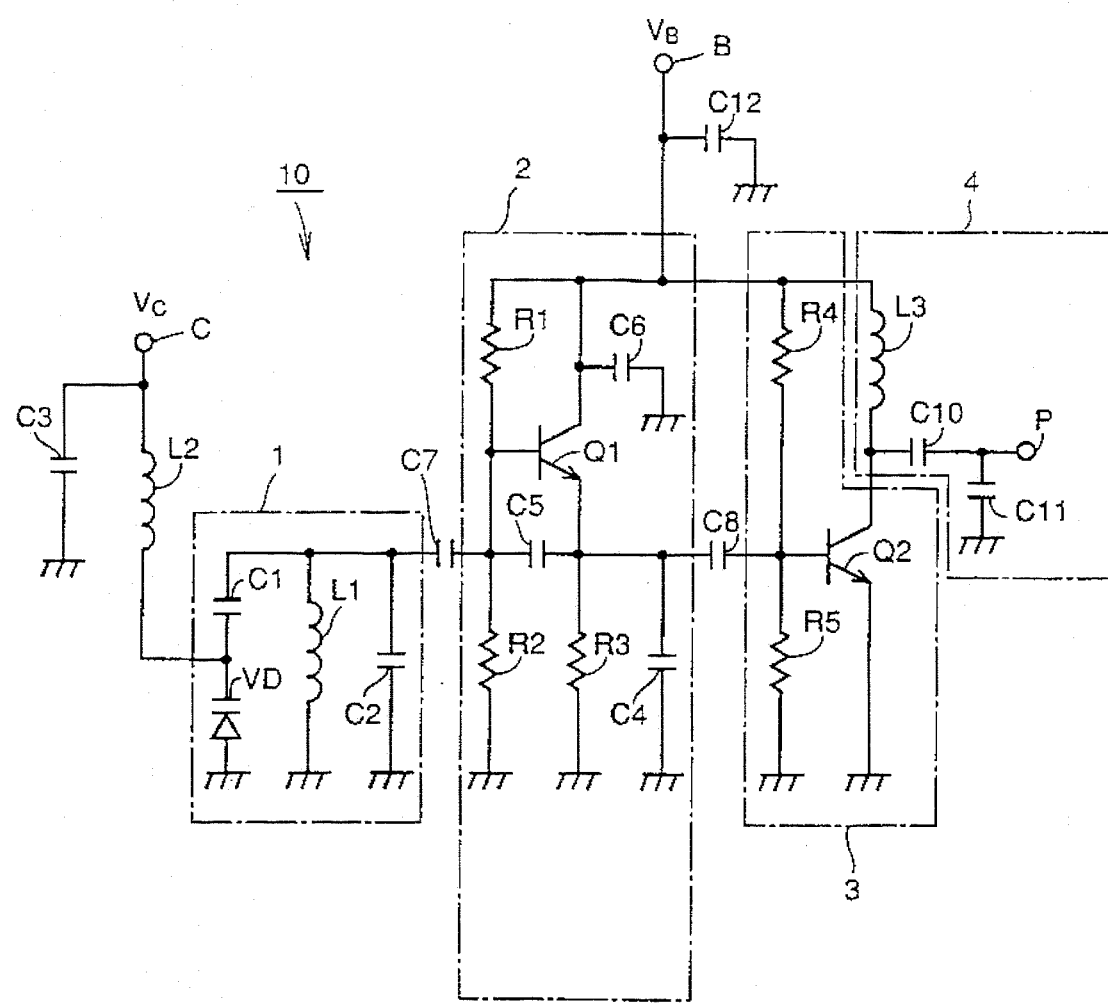
FIG. 1 is a circuit diagram of a conventional VCO.

Oscillation stage 2, buffer stage 3, and output matching stage 4 are structured as in the conventional case shown in FIG. 1. However, other circuit configurations may be employed for these stages, as far as they have the same functions. Buffer stage 3 and output matching stage 4 are not necessarily required.

The VCO structured as described above has respective components mounted on a substrate of alumina or the like. Choke coil L2 is formed as a conductive pattern of an arbitrary shape such as a serpentine shape or a linear shape printed on the substrate.

As described above, connecting impedance adjustment capacitor Cc to choke coil L2 in parallel increases the impedance of a circuit portion to which the control voltage is applied. Therefore, the capacitance value of impedance adjustment capacitor Cc is set so that various characteristics such as C/N characteristics, S/N characteristics, control voltage sensitivity characteristics and control voltage-to-oscillation frequency characteristics take prescribed values, respectively.

For the C/N characteristics and the S/N characteristics, it is said that the length of a conductive pattern forming choke coil L2 is optimally $\lambda/4$ (wherein $\lambda$ is the oscillation frequency of a VCO). When a substrate having a conductive pattern of a length for use in a VCO having an oscillation frequency of 950 MHz is used for a VCO of 880 MHz, the length of the conductive pattern is smaller than its optimal value. Therefore, the characteristics are deteriorated by approximately 2 dB. In this case, a parallel connection of impedance adjustment capacitor Cc of an 2.0 pF to choke coil L2 will prevent the deterioration.

For the control voltage sensitivity characteristics, in a VCO having an oscillation frequency in the 700 MHz range, changing the capacitance value of impedance adjustment capacitor Cc to approximately 4 pF causes the sensitivity of the control voltage to change (decrease) by approximately 2 MHz/V, as compared to the case where impedance adjustment capacitor Cc is not connected. The control voltage sensitivity characteristics can be changed also by changing the capacitance value of coupling capacitor C1 in resonance circuit 1. In this case, however, changing the value by only 0.5 pF causes the sensitivity of the control voltage to change by approximately 2 MHz/V. Therefore, changing the capacitance value of impedance adjustment capacitor Cc enables fine adjustment of the control voltage sensitivity characteristics, whereby the characteristics can easily attain a prescribed value.

Figure 3:
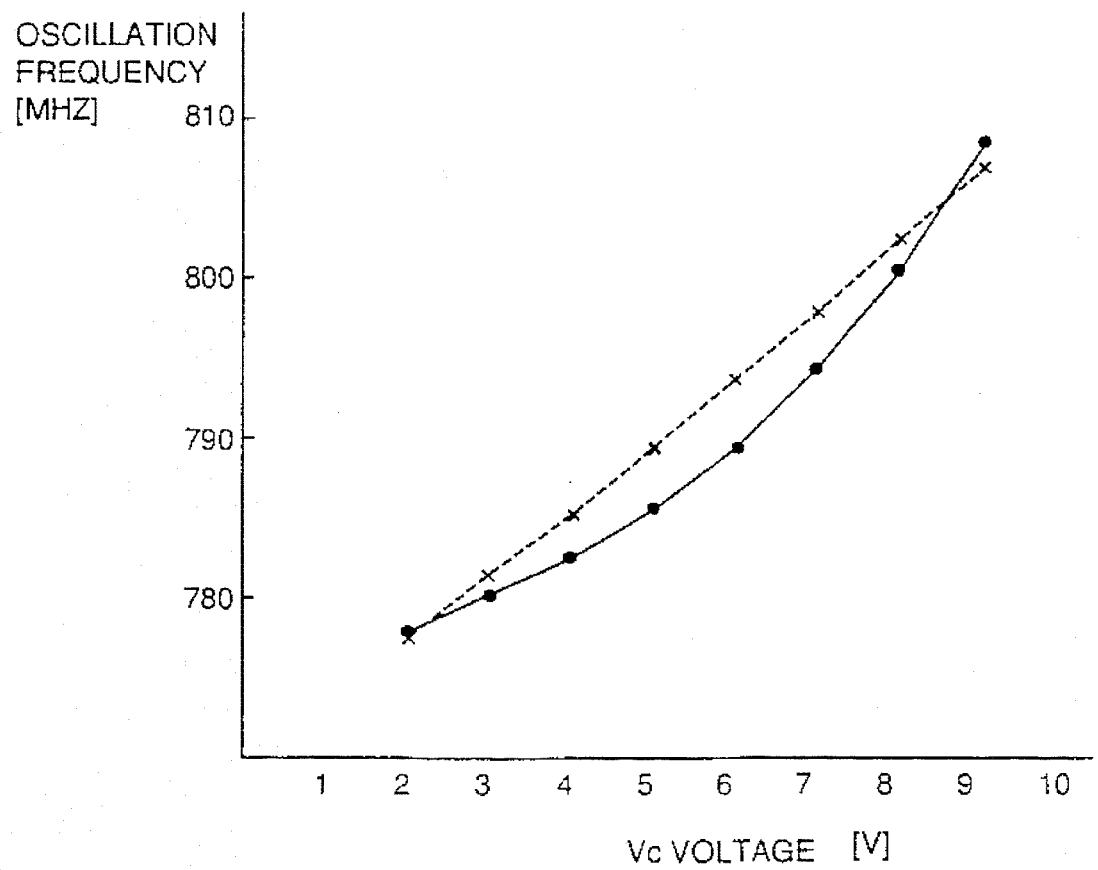
FIG. 3 is a diagram showing control voltage-to-oscillation frequency characteristics for explaining the embodiment of the present invention.

Further, improving the control voltage-to-oscillation frequency characteristics, in the case where the impedance of a circuit to which a control voltage is applied does not attain the optimal value in a VCO having an oscillation frequency in the 700 MHz range, the VCO has such characteristics as shown by a solid line in FIG. 3, for example. By connecting impedance adjustment capacitor Cc having the capacitance value of 4.5 pF to choke coil L2, the characteristics can be changed as shown by the dotted line in FIG. 3, making it possible to substantially improve the linearity.

It is needless to say that the above experimentally confirmed results can be obtained similarly in a VCO having an oscillation frequency different from the above oscillation frequency ranges mentioned.

As is clear from the above, by connecting impedance adjustment capacitor Cc to choke coil L2 in parallel, the impedance of a circuit to which a control voltage is applied can be increased. By setting the capacitance value of impedance adjustment capacitor Cc to an optimal value, various characteristics of a VCO can be given prescribed values. As a result, it is possible to manufacture a plurality of kinds of VCOs having different oscillation frequencies whose various characteristics take prescribed values with a substrate of one kind.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resonance circuit for a voltage-controlled oscillator, comprising:

a variable capacitance diode;

a choke coil including a conductive pattern located on a substrate, and having one end supplied with a control voltage and another end connected to said variable capacitance diode, for controlling a resonance frequency of the resonance circuit; and an impedance adjustment capacitor connected in parallel to said choke coil for adjusting an impedance between said one end of said choke coil and said variable capacitance diode.

2. The resonance circuit as recited in claim 1, wherein said resonance circuit further includes a coupling capacitor connected in series to said variable capacitance diode, and a resonance inductor and a resonance capacitor connected in parallel to a series circuit of said variable capacitance diode and said coupling capacitor, respectively.

3. The resonance circuit as recited in claim 1, wherein said variable capacitance diode is mounted on the same substrate as said choke coil.

4. The resonance circuit as recited in claim 3, wherein said resonance circuit further includes a coupling capacitor connected in series to said variable capacitance diode, and a resonance inductor and a resonance capacitor connected in parallel to a series circuit of said variable capacitance diode and said coupling capacitor, respectively.

5. A voltage-controlled oscillator, comprising:

a resonance circuit including a variable capacitance diode;

a choke coil including a conductive pattern located on a substrate, and having one end supplied with a control voltage and another end connected to said variable capacitance diode, for controlling a resonance frequency of the resonance circuit; and an impedance adjustment capacitor connected in parallel to said choke coil for adjusting an impedance between said one end of said choke coil and said variable capacitance diode;

an oscillation transistor having a base connected to said resonance circuit; and a capacitor which interconnects the base and emitter of the transistor, and a capacitor which connects the emitter of the transistor to ground, thereby forming a Colpitts oscillator.

6. The resonance circuit as recited in claim 5, wherein said resonance circuit further includes a coupling capacitor connected in series to said variable capacitance diode, and a resonance inductor and a resonance capacitor connected in parallel to a series circuit of said variable capacitance diode and said coupling capacitor, respectively.

7. The resonance circuit as recited in claim 5, wherein said variable capacitance diode is mounted on the same substrate as said choke coil.

8. The resonance circuit as recited in claim 7, wherein said resonance circuit further includes a coupling capacitor connected in series to said variable capacitance diode, and a resonance inductor and a resonance capacitor connected in parallel to a series circuit of said variable capacitance diode and said coupling capacitor, respectively.

* * * * *